United States Patent [19]

Lischke

[11] Patent Number: 4,601,971
[45] Date of Patent: Jul. 22, 1986

[54] TUNNEL CATHODE MASK FOR ELECTRON LITHOGRAPHY AND METHOD FOR MANUFACTURING AND OPERATING IT

[75] Inventor: Burkhard Lischke, Munich, Fed. Rep. of Germany

[73] Assignee: Siemens Aktiengesellschaft, Berlin & Munich, Fed. Rep. of Germany

[21] Appl. No.: 513,710

[22] Filed: Jul. 14, 1983

[30] Foreign Application Priority Data

Sep. 22, 1982 [DE] Fed. Rep. of Germany ....... 3235064

[51] Int. Cl.[4] .............................................. G03C 5/00
[52] U.S. Cl. ................................ 430/296; 250/492.3; 427/43.1; 430/942
[58] Field of Search ................... 250/492.2, 492.3, 310, 250/398; 427/43.1, 77, 74; 430/296, 942

[56] References Cited

U.S. PATENT DOCUMENTS

| | | | |
|---|---|---|---|
| 3,922,546 | 11/1975 | Livesay | 250/310 |
| 4,137,458 | 1/1979 | King et al. | 250/492.2 |
| 4,194,123 | 3/1980 | Wittry | 250/398 |
| 4,197,332 | 4/1980 | Broers et al. | 430/272 |
| 4,274,035 | 6/1981 | Fukuhara et al. | 250/398 |
| 4,331,505 | 5/1982 | Hirt | 430/296 |
| 4,377,627 | 3/1983 | Vinton | 430/296 |

FOREIGN PATENT DOCUMENTS 2840553 5/1979 Fed. Rep. of Germany .

OTHER PUBLICATIONS

Electronics, Nov. 3, 1981, "Electron-Beam Projector Suits up for Submicrometer Race" by Rodney Ward, Philips Research Laboratories, Redhill, Surrey, England.

Vacuum, vol. 31, No. 7, pp. 297 to 301, 1981 "Modelling of Electron Emission from Sandwich Cathodes" by R. Hrach (Mar. 24, 1981).

*Primary Examiner*—John H. Newsome
*Attorney, Agent, or Firm*—Hill, Van Santen, Steadman & Simpson

[57] ABSTRACT

A mask for corpuscular lithography permits a short exposure time for generating structures on semiconductor wafers, and provides a cost reduction of such structure generation. The mask has a tunnel cathode in corpuscle-emitting regions.

12 Claims, 5 Drawing Figures

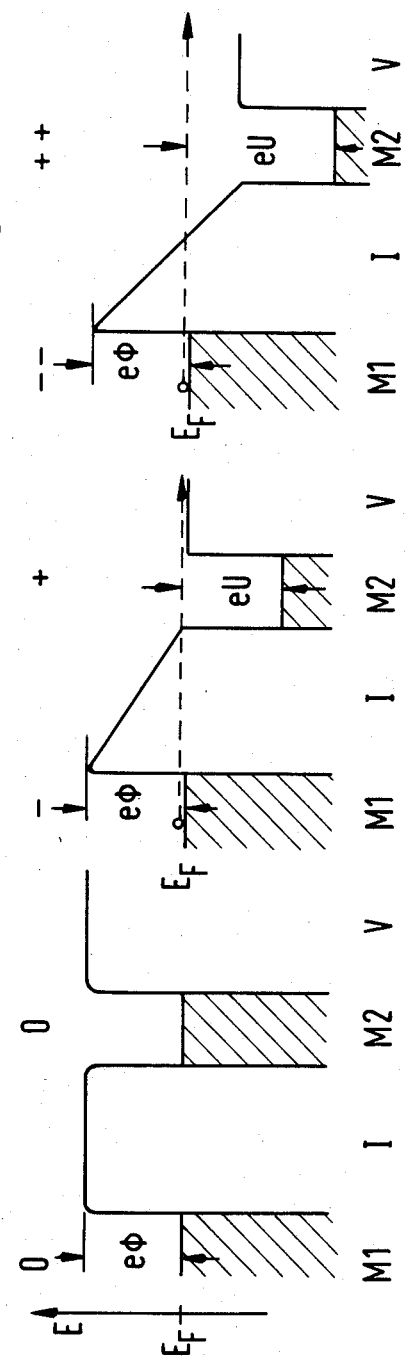
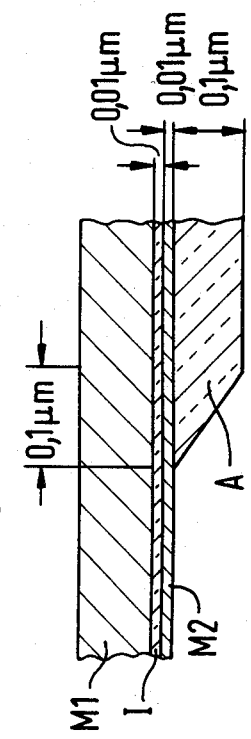

TUNNEL CATHODE MASK FOR ELECTRON LITHOGRAPHY AND METHOD FOR MANUFACTURING AND OPERATING IT

BACKGROUND OF THE INVENTION

The invention relates to a mask for corpuscular electron lithography.

The exposure times are very long given employment of an electron projector for generating structures on a semiconductor wafer, and the costs are therefore very high. An economical employment of the electron projector for the mass production of structures on, for example, semiconductors (integrated circuits) was therefore previously impossible.

The employment of the electron projector for generating structures is known, for example, from the publication by R. Ward in "Electronics", Nov. 3, 1981, 144 ff, or from European patent application EP0074691 A or from U.S. Pat. No. 3,585,433 incorporated herein by reference. Given this known method, the mask standard in lithographic methods for generating structures is additionally coated with cesium iodide so that, given irradiation of the mask with light, photoelectrons are emitted in the transparent regions of the mask. These photoelectrons in turn are imaged on the semiconductor wafer by means of parallel electrical and magnetic fields on the semiconductor wafer coated with photosensitive resist for generating structures. The exposure time is given by the quotient of the resist sensitivity of the photosensitive resist applied to the semiconductor wafer and of the cathode current density of the photocathode situated on the mask. This exposure time is on the order of 100 s given, for example, a $10^{-7}$ A/cm$^2$ cathode current density of the photocathode situated on the mask and given a standard resist sensitivity of the photosensitive resist disposed on the semiconductor wafer.

SUMMARY OF THE INVENTION

An object of the present invention is to specify a mask for corpuscular lithography of the type initially cited which enables a shorter exposure time for generating structures on semiconductor wafers and therefore enables a cost reduction of this structure generation.

This object is inventively achieved by means of a mask having a tunnel cathode in corpuscle-emitting regions. The exposure time for generating structures is reduced on the order of five times with a tunnel cathode mask according to the invention. The throughput of semiconductor wafers to be structured is then determined only by the change of wafer and the adjustment. Accordingly, a throughput of 1000 times of 4 inch wafers with sub-micron structures is possible without further expense. The economic feasibility of such a method is thus also assured.

The tunnel cathode mask according to the invention exploits the field effect for triggering the electrons and admits electron current densities of $10^{-2}$ A/cm$^2$ so that the exposure time is effectively reduced to $10^{-3}$ seconds.

BRIEF DESCRIPTION OF THE DRAWINGS

FIGS. 1 through 3 explain a theoretical model for the field emission from tunnel cathodes; and FIGS. 4 and 5 schematically show tunnel cathode masks for corpuscular lithography according to the invention.

DESCRIPTION OF THE PREFERRED EMBODIMENTS

FIGS. 1 through 3 schematically explain a theoretical model of the field emission from tunnel cathodes. This theoretical model was described by R. Hrach in "Vacuum", Vol. 31, No. 7, 1981, pp. 297 ff, incorporated herein by reference.

FIG. 1 shows a sandwich cathode which consists of a metal M1, an insulator I and of a further metal M2. The metal M2 is next to the vacuum V. Both the metal M1 as well as the metal M2 are situated at the potential zero in FIG. 1. The energy bands of both the metal M1 as well as the metal M2 are respectively fully occupied with electrons up to the Fermi characteristic-energy level $E_F$. An electron which exhibits the Fermi characteristic-energy level $E_F$ in a metal M1, M2 in FIG. 1 would have to have an energy in the amount of the work function $e\phi$ (with e=elementary charge) supplied to it in order to be able to assume a free energy condition, and thus in order to be able to move away from the metal M1, M2.

In FIG. 2, a voltage U has been applied to the sandwich cathode of FIG. 1, the amount of said voltage U corresponding to the work function potential $\phi$. The negative voltage is thereby applied to the metal M1 and the positive voltage is applied to the metal M2. An electron situated in the metal M1 which happens to exhibit an energy equal to the Fermi characteristic-energy level $E_F$ could thereby just tunnel through potential barrier between the negative metal electrode M1 and the dielectric represented by the insulator I. Such an electron, however, would then also have to penetrate the positive electrode M2.

When a voltge U as in FIG. 3 is applied to the sandwich cathode of FIG. 1 exceeding the work function voltage $\phi$, then electrons tunnel through the potential barrier between the negative metal electrode M1 and the dielectric I, and are then accelerated by the electric field in the dielectric so that some of the electrons can penetrate the thin, positive electrode M2 and emerge into the vacuum V. The current density due to field emission is described by the Fowler-Nordheim equation which may be found in physics textbooks and depends on the electrical field strength as well as on the work function voltage $\phi$.

FIGS. 4 and 5 schematically show inventive tunnel cathode masks for electron lithography. An inventive mask for electron lithography is constructed of a tunnel cathode. An absorber A is applied in the regions of an inventive mask which do not emit electrons. This absorber A either avoids a field emission in the regions not emitting electrons due to the greater electron spacing between the metals M1 and M2, or absorbs the electrons emitted into the absorber A because of its correspondingly great thickness.

A format of an inventive cathode mask is possible on the basis of the following arrangements or on the basis of a combination of the following arrangement:

(a) metal-insulator-metal—example—aluminum-10 nm aluminum oxide $Al_2O_3$-10 nm gold;

(b) doped semiconductor-dielectric-metal—example—n-silicon-10 nm silicon dioxide $SiO_2$-10 nm aluminum; and (c) metal-insulator-superconductor—example—aluminum-10 nm aluminum oxide Al$_2$O$_3$-niobium Nb.

The absorber A can consist of a metal or of a dielectric or of a combination of such materials. For example, the absorber A can exhibit gold, chrome, carbon, or photosensitive resist.

A mask according to the invention can, as is usual, be manufactured photolithographically, electron lithographically, or by means of irradiating the absorber regions to be formed with electrons, whereby, in the latter case these absorber regions are formed due to contamination with carbon (see A. Broers in German OS 28 40 553 U.S. Pat. No. 4,197,332 and 4,316,093, incorporated herein by reference).

When the entire surface of the cathode mask is formed by metal, then it is easy to clean this mask by means of selective plasma etching. When adjustment marks are separately electrically provided by insulator I1 from the metals M1, M2 on the cathode mask, then application of a voltage U of, for example, 10 volts to the two metal adjustment mark electrodes M1', M2' which exhibit a spacing of 10 nm suffices to erect an electrical field of $10^7$ V/cm between the two metal electrodes M1', M2' and thus to trigger adjustment mark field emission. The electrons emerging from the cathode mask at metals M1'; M2' of the invention are employed for adjustment. After this adjustment, a voltage U is applied to the mask electrically insulated from the marks at M1 and M2 (this insulation I$_1$) can, for example, occur by means of a laser miller) in order to initiate field emission and thus the exposure step.

An electron projector in which an inventive cathode mask can be employed is known from the aforementioned publication by R. Ward or from U.S. Pat. No. 3,585,433, incorporated herein by reference.

The absorber A in FIG. 5 exhibits a thickness of 100 nm. The absorber A reaches this thickness of 100 nm at the junction between a region emitting electrons and a region not emitting electrons in a transition area of approximately 100 nm. Given the tunnel cathode mask of FIG. 5, the absorber A is applied to the metal M2 in a region not emitting electrons. Given the tunnel cathode mask of FIG. 4, the absorber A is applied to the insulator I and the metal M2 is in turn applied to the absorber A. In FIG. 4, a field emission is avoided in the region not emitting electrons because of the greater electrode spacing between the metal M1 and the metal M2. In FIG. 5, the emitted electrons which have tunneled through the potential barrier between the metal M1 and the insulator I and which have penetrated the metal M2 are absorbed in the absorber A.

Although various minor changes and modifications might be proposed by those skilled in the art, it will be understood that I wish to include within the claims of the patent warranted hereon all such changes and modifications as reasonably come within my contribution to the art.

I claim as my invention

1. In a mask for electron projection corpuscular lithography, the improvement comprising providing the mask as a tunnel cathode having a sandwich structure with an insulating region through which electrons tunnel in corpuscle-emitting regions and non-corpuscle emitting regions of the mask, and an absorber means being provided at the non-corpuscle emitting regions for absorbing electrons.

2. The mask according to claim 1 wherein a structure comprising metal-insulator-metal is provided in the corpuscle-emitting regions.

3. The mask according to claim 1 wherein a structure comprising doped semiconductor-dielectricmetal is provided in the corpuscle-emitting regions.

4. The mask according to claim 1 wherein at least one absorber consists of a metal.

5. The mask according to claim 2 wherein at least one absorber region consists of a dielectric.

6. A method for adjusting a position of a mask for electron projection corpuscular lithography having a tunnel cathode in corpuscle-emitting regions of the mask, comprising the steps of:
providing the mask as a tunnel cathode with a sandwich construction of a first metal, an absorber region, and a second metal;
providing adjusting marks formed of first and second adjustment mark metals spaced by an insulator as a part of the mask which are electrically insulated from the first and second metals and which each also form tunnel cathodes; and
adjusting the mask by energizing the adjusting mark tunnel cathodes while the tunnel cathode for the actual lithography is not energized and using electrons emitted from the adjustment marks to adjust the position of the mask, whereby thereafter the tunnel cathode for the actual lithography may be energized.

7. In a mask for electron projection corpuscular lithography, the improvement comprising a tunnel cathode in corpuscle-emitting regions of the mask, and wherein a structure comprising metal-insulator-superconductor is provided at said corpuscle-emitting regions.

8. A method for manufacturing a mask for electron projection corpuscular lithography, comprising the steps of:
forming a tunnel cathode by providing a first metal layer, an insulating layer on a surface of the first metal layer, absorber regions at portions of the mask at which electron emission is not to occur, and a second metal layer overlying the insulating layer and the absorber regions, said second metal layer being sufficiently thin and the insulator being sufficiently thin so as to permit tunnel cathode electron emission from the first metal through the insulator and through the second metal onto a surface to be lithographed, the absorber regions being sufficiently thick to absorb emitted electrons; and
forming said absorber region prior to application of the second metal layer by radiating regions at which it is desired to form the absorber regions so that absorber regions are grown thereat due to contamination with carbon in a vacuum in which the absorber regions are being grown.

9. A method for manufacturing a mask for electron projection corpuscular lithography, comprising the steps of:
forming a tunnel cathode by providing a first metal layer, an insulating layer on a surface of the first metal layer, absorber regions at portions of the mask at which electron emission is not to occur, and a second metal layer overlying the insulating layer and between the absorber regions and the first metal layer, said second metal layer being sufficiently thin and the insulator being sufficiently thin so as to permit tunnel cathode electron emission from the first metal through the insulator and through the second metal onto a surface to be lithographed, the absorber regions being sufficiently thick to absorb emitted electrons; and forming said absorber regions after application of the second metal layer by radiating regions at which it is desired to form the absorber regions so that absorber regions are grown thereat due to contamination with carbon in a vacuum in which the absorber regions are being grown.

10. A mask for electron projection corpuscular lithography, comprising:

a first metal layer;

an insulating layer on a surface of the first metal layer;

a second relatively thinner metal layer on the insulating layer except for portions of the mask at which electron emission is not to occur from the mask, said locations having absorbing regions;

the insulating layer and the second metal layer being sufficiently thin so as to provide a tunnel cathode effect such that when a potential is applied between the first and second metal layers, electrons will pass through the insulating layer and the second layer so as to be available for lithographing a desired surface; and the absorber region being sufficiently thick so as to absorb electrons passing through the insulating layer from the first metal layer.

11. A mask for electron projection corpuscular lithography, comprising:

a first metal layer;

an insulating layer on a surface of the first metal layer;

a second relatively thinner metal layer on the insulating layer;

portions of the mask at which electron emission is not to occur having absorbing regions on a surface of the second metal layer opposite portions of the insulating layer; and the insulating layer and the second metal layer being sufficiently thin so as to provide a tunnel cathode effect wuch that when a potential is applied between the first and second metal layers, electrons will pass through the insulating layer and the second metal layer so as to be available for lithographing a desired surface; and the absorber regions being sufficiently thick so as to absorb electrons passing through the insulating layer and second metal layer from the first metal layer.

12. A method for electron projection corpuscular lithography, comprising the steps of:

providing first and second metal layers with an insulator therebetween and wherein the insulator and the second metal layer are sufficiently thin so as to permit a tunnel cathode electron emission at desired regions for lithographing a surface, and wherein at other regions from which electron emission is not to occur, providing an absorber region of thickness sufficient to prevent tunnel cathode emission when a voltge is applied across metal layers M1 and M2 sufficient to cause tunnel cathode emission at the desired regions.

* * * * *